INVENTOR
F.J. SCHNEIDER
BY R.P. Miller
ATTORNEY

United States Patent Office 3,452,917

Patented July 1, 1969

3,452,917

BONDING BEAM-LEADED DEVICES TO SUBSTRATES

Fred J. Schneider, Catasauqua, Pa., assignor to Western Electric Company, Incorporated, New York, N.Y., a corporation of New York Filed Nov. 13, 1967, Ser. No. 682,454
Int. Cl. B23k 37/04, 1/14
U.S. Cl. 228—49 17 Claims

ABSTRACT OF THE DISCLOSURE

An apparatus for simultaneously bonding leads extending from a beam-leaded device to conductive areas on a substrate incorporates a hollow bonding tip mounted for universal pivoting movement to distribute bonding forces uniformly over the leads. The bonding tip is normally seated in a tapered pocket formed in a support block and only moves out of engagement with the block during application of bonding forces to the leads. Pickup facilities mounted within the hollow bonding tip accurately position the beam-leaded device within an opening in the bonding face of the bonding tip prior to application of bonding forces.

*Background of the invention*

In the manufacture of integrated circuits, a plurality of interconnected semiconductor components, such as transistors and diodes, are fabricated on a single piece of semiconductor material. Beam leads are attached to terminals on the semiconductor body and extend in cantilever fashion therefrom. The resulting structure is termed a beam-leaded device.

In order to produce an operative circuit, it may be necessary to connect the terminals of the beam-leaded device to passive circuit elements, such as resistors and capacitors. In the art of integrated circuitry, the passive components of an electrical circuit are usually formed on the surface of a glass or ceramic substrate. The passive elements may be produced by vacuum deposition of a thin-film metallic layer on the substrate surface, followed by selective etching and anodizing of the deposited metal to form the desired components. Coincident with the production of the passive circuit elements is the formation of conductors or leads on the substrate surface. The conductors are selectively connected to various passive components, and a predetermined group of conductors terminate in a common area on the substrate surface in a configuration corresponding to the arrangement of beam leads extending from the semiconductor body. Thus, in order to complete the integrated circuit, the beam leads must be connected to the corresponding conductors on the substrate surface.

In the prior art, methods and apparatus have been devised for bonding the beam leads to conductors on a substrate utilizing ultrasonic or thermocompression techniques. In one such technique the leads are bonded, one at a time, to the corresponding conductors by bringing a bonding tool in contact with one of the leads, pressing the lead into engagement with the corresponding conductor, and applying bonding energy in the form of heat or ultrasonic vibrations to the lead and conductor through the bonding tool. This operation is repeated on each of the leads until all have been bonded to the conductors. The obvious disadvantage of this bonding technique is that it is extremely time-consuming.

To reduce the time required for bonding, other techniques have been developed in which all of the leads extending from the beam-leaded device are bonded simultaneously. Bonding tools have been designed to contact all of the leads at one time and to apply bonding forces and energy simultaneously to the leads. In the simultaneous bonding techniques, the problem of compensating for variations in the lead thickness, substrate thickness, machine variations, and for substrate surface irregularities arises. Because the dimensions of the beam leads are relatively small (e.g., 6 mils in length, 2 mils in width, and 0.5 mil in thickness), slight variations in the thickness of the substrate or small surface irregularities may produce substantial variation in the bonding forces applied to each lead when the bonding tool engages all the leads simultaneously. Therefore, to insure that uniform bonding forces are applied to the beam leads, it is desirable that a bonding apparatus for performing simultaneous bonding of beam leads compensate for nonuniformity in substrate thickness and surface irregularities of the substrate.

To further reduce the required bonding time, the bonding apparatus should be capable of automatic or semiautomatic operation.

*Summary of the invention*

The present invention contemplates an apparatus for simultaneously bonding leads extending from a beam-leaded device to conductive areas on a substrate. One feature of the invention is the provision of a bonding head which compensates for variation in substrate thickness and for surface irregularities of the substrate as well as machine variations to apply uniform bonding forces to the leads. This result is accomplished by mounting a bonding tip for universal pivotal movement over a support member having a curved surface. When the bonding tip is brought into contact with the leads of a beam-leaded device to urge the leads against the conductors formed on a substrate, the bonding tip is permitted to pivot to an equilibrium position where bonding forces applied to the leads by the bonding tip are uniformly distributed.

The bonding tool of the invention may include a hollow bonding tip having a planar bonding surface for engaging the beam leads and applying bonding forces thereto. This bonding tip has an aperture, formed at the center of the bonding surface and extending into the hollow interior of the bonding tip, for receiving the semiconductor body of the beam-leaded device. The interior surface of the bonding tip located adjacent to the aperture is tapered to form a shoulder.

A hollow rod having a rounded end is received within the hollow interior of the bonding tip with its rounded end engaging the interior, tapered surface or shoulder of the tip. The rod supports the bonding tip for pivotal movement over its rounded end, and this pivotal movement of the tip provides the necessary compensation in order to apply uniform bonding forces to the leads.

In addition to the compensating feature, the bonding tool of the present invention also may include facilities for picking up the beam-leaded device, before bonding, and for accurately positioning the device within the aperture to align the beam leads with the planar bonding surface. These pickup facilities may include a tube, movably mounted within the hollow rod and normally projecting from the bonding tip, to which a vacuum source is connected to apply a suction force to the semiconductor body portion of the beam-leaded device. After the device is picked up, the tube may be drawn into the bonding tip to move the device into the aperture. In the alternative, the pickup tube may be maintained in its normally projecting position until the bonding head moves the beam-leaded device into engagement with the substrate to which it is to be bonded.

*Brief description of the drawing*

The objects and advantages of the present invention may be understood by considerating the following detailed description in conjunction with the accompanying drawing, wherein.

*Detailed description*

Figure 1:
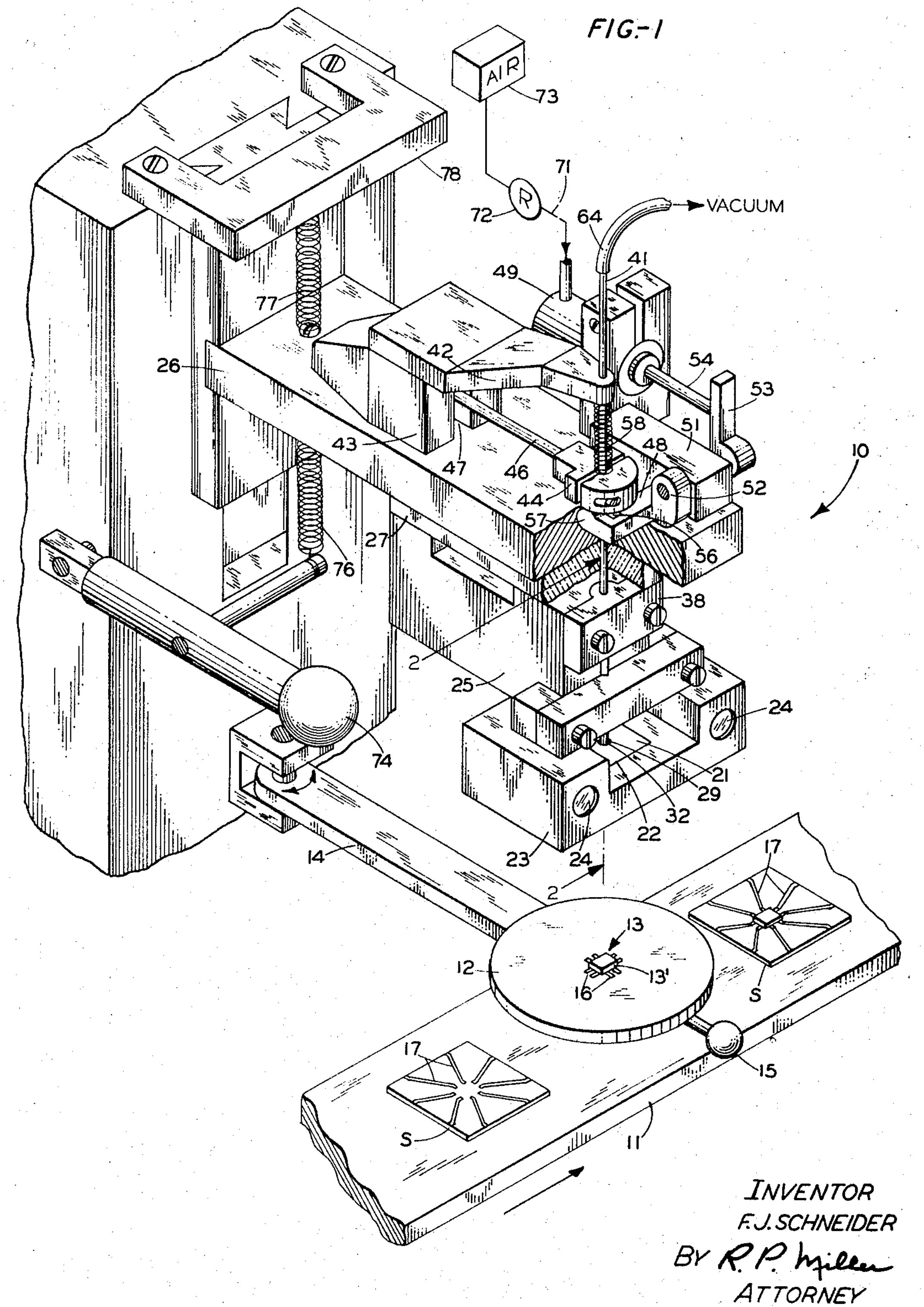
FIG. 1 is a perspective view, partially in section, of a bonding apparatus, incorporating the principles of the present invention, for bonding beam-leaded devices to substrates which are advanced along a conveyor.

In FIG. 1 a bonding apparatus which embodies the principles of the present invention is shown. The apparatus comprises a bonding head 10 which is mounted above a conveyor 11 and is capable of reciprocating movement relative to the conveyor. The conveyor 11 is advanced intermittently to move substrates S to and from a working position located below the bonding head 10. An adjustable platform 12 for supporting a beam-leaded device 13 is mounted to the apparatus by a pivot arm 14. The pivot arm 14 is provided with means, for example, a handle 15, for pivoting the arm 14 and platform 12 toward and away from the bonding head 10. In the operation of the bonding apparatus, the beam-leaded device 13 is first oriented in a predetermined pickup position by adjusting the platform 12. Next, the bonding head 10 is lowered to the pickup position to pick up the beam-leaded device 13 after which it is raised to its initial position to lift the device 13 from the platform 12. After the platform 12 is pivoted away from its initial position over the conveyor 11, the bonding head 10 is again lowered to move the beam-leaded device 13 onto a substrate S, aligned with the bonding head 10, such that leads 16, extending from a semiconductor body portion 13' of the device 13, are in registration with conductors 17, formed on the substrate S. The bonding head 10 applies bonding pressure and energy to the leads 16 to bond the leads to the conductors 17.

Figure 2:
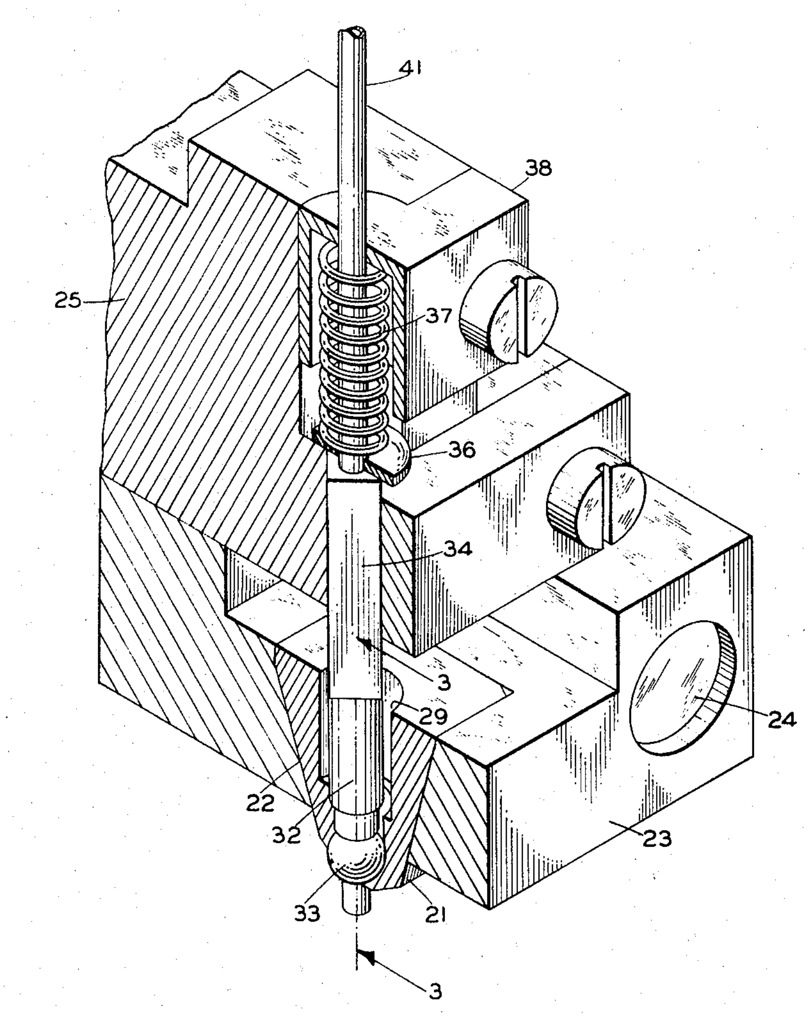
FIG. 2 is a sectional, perspective view taken along line 2—2 of FIG. 1 illustrating a hollow bonding tip and a support rod having a spherically-shaped end on which the bonding tip is mounted for pivotal movement.
Figure 3:
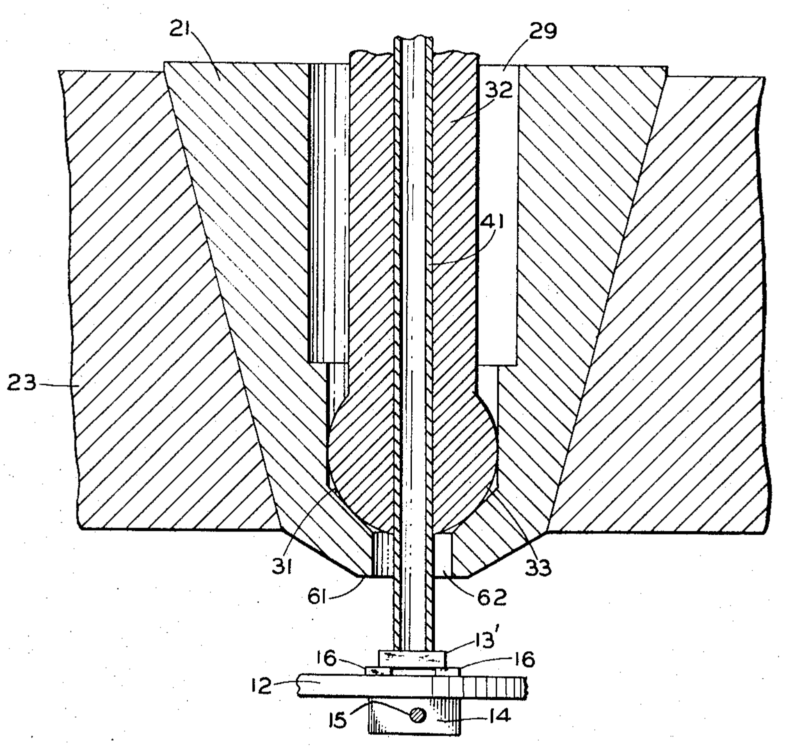
FIG. 3 is a sectional view, taken along line 3—3 of FIG. 2, illustrating a vacuum pickup tube which is mounted within the bonding tip for sliding movement through the spherical end of the support rod.

Considering the structural elements of the apparatus in more detail, the bonding head 10 includes a bonding tip 21 (FIGS. 1 and 2) having tapered sides. The bonding tip 21 is received in an opening or socket 22, formed in a support block 23, having a square-shaped cross section. The opening 22 extends entirely through the support block 23, and the four side walls of the opening 22 are equally slanted or tapered to form a pocket in which the bonding tip 21 is received. As shown in FIG. 2, the dimensions of the bonding tip 21 are chosen such that the lower portion of the bonding tip 21 projects downward past the bottom surface of the support block 23. The slanted walls of the opening 22 engage the tapered sides of the bonding tip 21 to limit downward movement of the bonding tip 21 relative to the support block 23. Referring to FIGS. 2 and 3, the corners formed by the tapered sides of the bonding tip 21 are chamfered to allow the tip 21 to move freely into and out of the opening 22.

The support block 23 is provided with a pair of heating cartridges 24—24 (see FIGS. 1 and 2) which supply bonding energy in the form of heat to the bonding tip 21 through the support block 23. The support block 23, which is composed of heat conducting material, is mounted on a support 25 secured to an arm 26. An insulating plate 27 is interposed between the support 25 and the arm 26 to prevent heat generated by the heating cartridges 24—24 from raising the temperature of the arm 26.

Referring to FIGS. 2 and 3, the bonding tip 21 is provided with a bore or cavity 29 which extends downward from the top surface of the bonding tip 21. As shown in FIG. 3, at the lower portion of the cavity 29, the cavity wall is stepped and then tapered inwardly to form a shoulder 31. The bonding apparatus also includes a rod 32 having a curved surface 33 formed at its lower end. As shown in FIGS 2 and 3, the curved surface 33 may be spherical. An upper portion or shank section 34 (FIG. 2) of the rod 32 has a rectangular cross section and is received in a rectangular passage extending through the support 25 for sliding movement therethrough. A small washer disc 36 is mounted on and abuts the upper end of the rod 32. A spiral spring 37, confined in a spring housing 38 secured to the support 25, applies a downward force to the disc 36 and rod 32 which urges the curved end of the rod into engagement with the shoulder 31 to bias the bonding tip 21 downward against the slanted walls of the opening 22 in the support block 23. The disc 36 is normally located a small distance below the bottom of the spring housing 38.

As indicated in FIG. 3, the rod 32 has an axial bore extending for its entire length. A pickup tube 41 is received within the bore in the rod 32 and is mounted for sliding movement therethrough. As shown in FIG. 1, the pickup tube 41 extends upward through the rod 32 and the washer disc 36, and through the arm 26 and the insulating plate 27. The upper portion of the tube 41 passes through a bracket 42 mounted in the arm 26 by a guide block 43.

A clamp 44 is attached to the tube 41 below the bracket 42, and a shaft 46 extends from the clamp 44 toward the guide block 43. The guide block 43 has a vertical guide slot 47 formed in its front surface for receiving the extended end of the shaft 46. The shaft 46 is confined to move in the vertical slot 47 and thus prevents the tube 41 from rotating when the tube 41 is moved in the vertical direction.

Vertical movement is imparted to the tube 41 by a lifting mechanism including a rocker arm 48 (see FIG. 1) which is operated by an air cylinder 49. The rocker arm 48 is mounted on one end of a pivot pin 52 extending through a bearing block 51 which is fixed to the arm 26. A lever 53 is connected to the other projecting end of the pivot pin 52 and is operated by a piston rod 54 extending from the front end of the air cylinder 49. The air cylinder 49 is provided with an air inlet to which a line 71 is coupled. The line 71 is connected to a valve 72 which, in turn, is connected to a source 73 of pressurized air.

As shown in FIG. 1, the rocker arm 48 is provided with a rectangular slot 56 which receives a portion of the tube 41 and allows the tube 41 and the rocker arm 48 to move relative to one another. The rocker arm 48 also has an enlarged lobe 57 which engages the bottom of the clamp 44. A compression spring 58 is mounted over the tube 41 between the bracket 42 and the clamp 44 and applies a force to the clamp 44 which biases the tube 41 in a downward direction. Thus, when the air cylinder 49 is unoperated, the force exerted by the spring 58 is sufficient to maintain the tube 41 in its lowermost position which is determined by the clamp 44 and rocker arm 48. When the tube 41 is in this position, the clamp 44 is urged against the enlarged lobe 57 of the rocker arm 48 and lever 53 is held in its vertical position as shown in FIG. 1.

Figure 4:
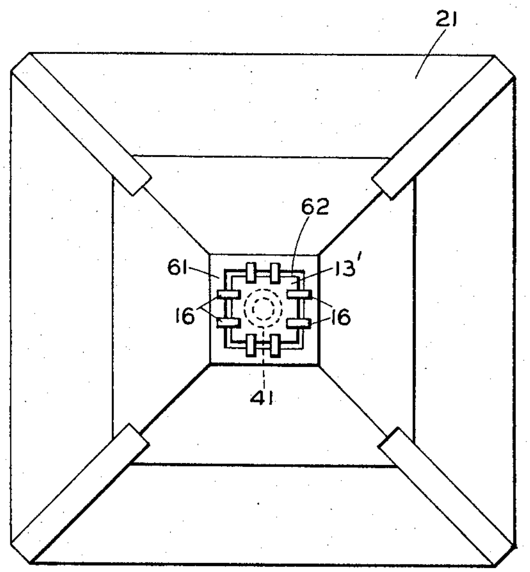
FIG. 4 is a bottom view illustrating the bonding surface of the bonding tip of the present invention.

Referring next to FIGS. 3 and 4, the bonding tip 21 is provided with a planar bonding surface 61 and a rectangular opening or aperture 62 which extends into the bonding tip 21 and terminates at the base of the tapered shoulder 31. As shown in FIG. 4, the bonding surface 61 is in the form of a narrow frame surrounding the opening 62. When the pickup tube 41 is in its normal, downward position, the lower end of the tube 41 projects through the opening 62 and terminates at a distance below the bonding surface 61. The pickup tube 41 may be withdrawn into the rod 32 to move a beam-leaded device into the rectangular opening 62. A partial vacuum is applied to the pickup tube 41 through a line 64 (FIG. 1), connected to the upper end of the tube 41, to apply a vacuum force to a beam-leaded device 13 located beneath the lower end of the pickup tube 41 on the platform 12. When the tube 41 is drawn upward into the rod 32 by opening the valve 72 to apply pressurized air to the air cylinder 49, the semiconductor body of the beam-leaded device 13 is moved into the opening 62 and the beam leads 16 of the device 13 are moved into engagement wtih the bonding surface 61.

In the operation of the apparatus, substrates S are advanced by the conveyor 11 to a working position located beneath the bonding head 10. The conveyor 11 moves intermittently so that each substrate S is stopped in the working position. To initiate the bonding operation, a beam-leaded device 13 on the platform 12 is brought into a predetermined pickup position by adjusting the position of the platform 12 relative to the bonding head 10. The alignment of the beam-leaded device 13 with the predetermined pickup position may be accomplished by means of an optical system (not shown) having its focal point located at the pickup position.

After the beam-leaded device 13 is positioned in the predetermined pickup position, the arm 26 is moved downward by grasping a handle 74, pivotally mounted to the apparatus and connected to the arm 26 by a spring 76, to lower the bonding head 10 toward the platform 12. When the lower end of the pickup tube 41 moves into contact with the beam-leaded device 13, the downward movement of the bonding head 10 is terminated. The beam-leaded device 13 is held against this end of the tube 41 by a suction force which results from the partial vacuum applied to the tube 41 through the line 64. Then pressurized air is applied to the air cylinder 49 by opening the valve 72, to drive the piston rod 54 against the lever 53 to pivot the rocker arm 48 and rotate the pivot pin 52. Upon pivotng of the rocker arm 48, its enlarged lobe 57 is raised against the bottom surface of the clamp 44 to move the clamp 44 and the pickup tube 41 upward. The clamp 44 is raised against the bias of the spring 58 and is held in its raised position as long as the air cylinder 49 is operated. Rotational movement of the tube 41 is prevented by the shaft 46 which projects from the clamp 44 into the vertical guide slot 47 formed in the guide block 43. Since the pickup tube 41 does not rotate, the beam-leaded device 13 remains in its original orientation relative to the bonding surface 61 and the opening 62 of the bonding tip 21.

Figure 5:
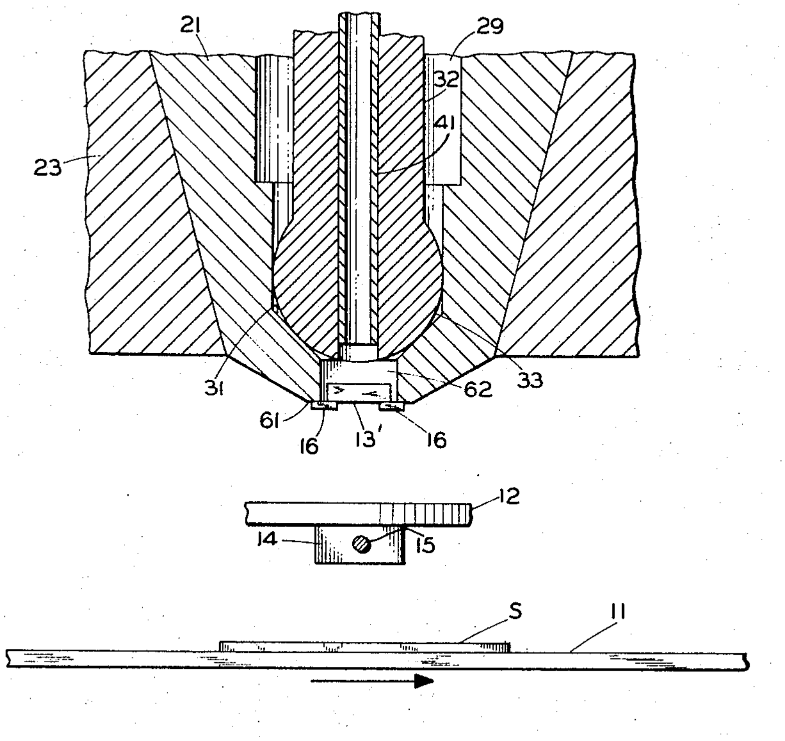
FIG. 5 is a sectional view similar to FIG. 3 showing the retracted position of the pickup tube after a beam-leaded device has been picked up.

As the pickup tube 41 is drawn upward into the bonding tip 21, the beam-leaded device 13 is raised from the platform 12 and the body portion 13′ is moved into the opening 62. When the leads 16 of the beam-leaded device 13 move into engagement with the bonding surface 61 (FIG. 5), the upward movement of the beam-leaded device 13 terminates, even though the tube 41 may continue to move upward. The pickup tube lifting mechanism is designed to continue the upward movement of the pickup tube 41 after the leads 16 move into contact with the bonding surface 61 such that the lower end of the pickup tube 41 is moved out of contact with the beam-leaded device 13, as shown in FIG. 5. The tube 41 moves out of contact with, but is held adjacent to the upper surface of body 13′ so that a vacuum force acts on the body 13′ to hold it within the opening 62 and the leads 16 are abutted against the bonding surface 61. At this point, the beam-leaded device 13 is held in the opening 62, even though the pickup tube 41 is no longer in contact with the beam-leaded device 13, by the partial vacuum applied to the line 64, and will remain in this position as long as the partial vacuum is applied.

As the beam-leaded device 13 is moved into the opening 62, the bonding head 10 is returned to its initial position by releasing the lever 74 thereby allowing a spring 77, connected to the arm 26 and a bracket 78, to raise the bonding head 10. The platform 12 is pivoted out of the path of movement of the bonding head 10 by grasping the handle 15. The conveyor 11 is advanced by an indexing mechanism (not shown) to move a substrate S into the working position located beneath the bonding head 10. By utilizing the optical system mentioned above, the conductors 17 on the substrate S may be moved into registration with the leads 16 of the beam-leaded device 13 held by the bonding head 10. Then the arm 26 is again moved downward by grasping the lever 74 to lower the bonding head 10 toward the substrate S. The beam-leaded device 13 is moved into engagement with the substrate S with the leads 16 overlying the conductors 17.

Figure 6:
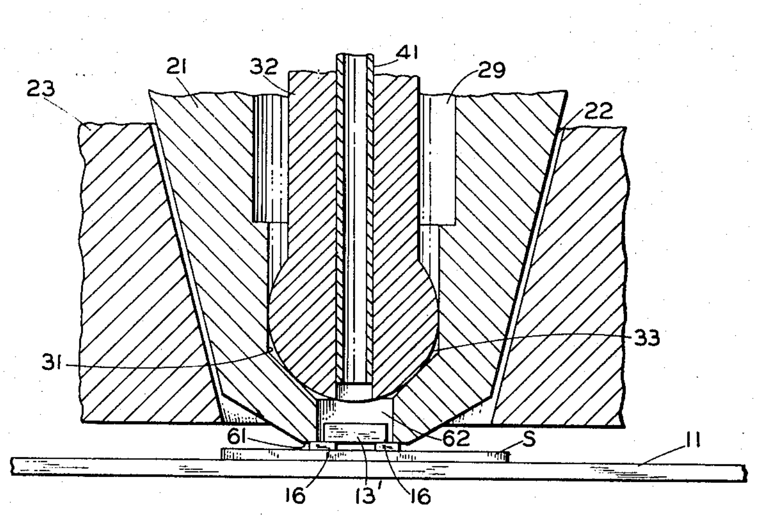
FIG. 6 is a sectional view of the bonding tip of FIG. 3 illustrating the position of the bonding tip during bonding of the beam-leaded device to a substrate on the conveyor.

As shown in FIG. 6, when the beam-leaded device 13 engages the substrate S, the downward motion of the bonding tip 21 is terminated, but the support block 23 continues to move downwardly for a short distance after the bonding tip 21 is stopped. Since the bonding tip 21 is stopped, the downward movement of the support block 23 compresses the spring 37, and a downward force is applied to the bonding tip 21 which is transmitted to the leads 16 through the bonding surface 61. The movement of the support block 23 relative to the bonding tip 21 terminates when the disc 36, which serves as a stop for limiting the amount of relative movement between the support block 23 and bonding tip 21, engages the bottom of housing 38. As a result of the relative movement between the bonding tip 21 and the support block 23, the tapered sides of the bonding tip 21 are moved out of engagement with the slanted walls of the support member 23 and the bonding tip 21 is moved out of the pocket formed in the support member 23. At this point, the bonding tip 21 is free to pivot over the spherical end of the rod 32. A predetermined downward force may then be applied to the lever 74 which is transmitted through the spring 76 to the arm 26 and rod 36 to increase the bonding forces exerted on the leads 16. If, for any reason, the bonding forces applied to the leads 16 by the bonding tip 21 are not uniformly distributed, then the bonding tip 21 pivots over the spherical end of the rod 32 to an equilibrium position where the bonding forces are more evenly distributed.

Bonding energy in the form of heat is continuously supplied to the support member 23 by the heating cartridges 24—24. The support member 23 is constructed of heat conducting material so that the bonding energy is conducted to the bonding tip 21 as long as its tapered sides engage the slanted walls of the pocket in the support member 23. When the leads 16 of the beam-leaded device 13 are pressed into engagement with the conductors 17 on the substrate S, mechanical bonding forces and bonding energy in the form of heat are applied to the leads and conductors through the bonding tip 21. The bonding tip 21 is pressed against the leads 16 for a period of time, determined by beam lead and conductor material and the size of the areas to be bonded, to bond the leads 16 to the conductors 17.

After the bonding of the leads 16 is completed, the bonding head 10 is lifted from the conveyor 11 by releasing the lever 74 to allow the arm 26 to return to its raised position under the action of the spring 77. As the bonding head 10 moves upward, the bonding tip 21 is returned to its original position in the pocket formed in the support member 23 by the spring 37. At the same time, the air cylinder 49 is deactivated by closing the valve 72 to allow the spring 58 to return the clamp 44 and the pickup tube 41 to their initial positions on the bonding head 10. Upon return of arm 26 to the up position, the pickup tube 41 is again located in the position shown in FIG. 2, with its lower end projecting downward from the bonding tip 21. The bonding apparatus is now prepared for another bonding operation. Subsequent bonding operations are performed in exactly the same manner as described above.

In the above-described operation of the bonding apparatus of the present invention, the pickup tube 41 was drawn upward into the bonding tip 21 by a lifting mechanism to move the beam-leaded device 13 into the opening 62 prior to actual bonding of the device 13 to the substrate S. It should be noted, however, that the bonding head 10 may be operated without moving the pickup tube 41 into the bonding tip 21 before the beam-leaded device 13 is moved onto the substrate S. If the bonding head 10 is operated in this manner, the lifting mechanism is not activated and the pickup tube 41 remains in its downward projecting position (FIG. 3) both before and after the device 13 is picked up from the platform 12. When the bonding head 10 is lowered toward the substrate S by applying a downward force to the lever 74, the beam-leaded device 13 held on the end of pickup tube 41 is moved into engagement with the upper surface of the substrate S. The downward motion of the device 13 and tube 41 is terminated when the leads 16 contact the substrate S.

As the downward movement of the bonding head 10 continues, the rod 32 and tip 21 slide downward over the tube 41 and the spring 58 is compressed by downward movement of the bracket 42 to apply a small downward force through the tube 41, to the beam-leaded device 13. The tube 41 is prevented from rotating by virtue of the shaft 46 and guide slot 47. The bonding tip 21 and rod 32 continue their downward movement until the bonding surface 61 engages the leads 16. At this point, the motion of the bonding tip 21 terminates, and spring 37 is compressed by further downward movement of the housing 38 of the bonding head 10. As described above, the downward motion of the bonding head 10 is continued for a short distance (until the disc 36 contacts the bottom of housing 38). Since the bonding tip 21 is stopped, the downward movement of the support block 23 relative to the bonding tip 21 results in the tapered sides of the tip 21 separating from the slanted walls of the support block 23 so that the tip 21 is free to pivot over the spherical end of rod 32. Then a downward force is applied to the arm 26 by the lever 74 and is transmitted to the leads 16 through the rod 32 and bonding tip 21 to initiate bonding of the leads 16.

During the application of bonding forces to the leads 16 through the bonding surface 61, the tube 41 remains in contact with the beam-leaded device to apply a small downward force thereto. This small force counteracts the tendency of the device 13 to rise as the leads 16 are deformed under the application of bonding forces and constrains the device 13 during the bonding of the leads 16 to the conductors 17 on the substrate S. The constraint imposed on the beam-leaded device 13 is a primary difference between the two modes of operation discussed herein. After the bonding of the leads 16 is completed, the bonding head 10 is raised to its initial position by releasing the lever 74 and the springs 37 and 38 return the tip 21 and pickup tube 41 to their original positions in preparation for a subsequent bonding operation.

The bonding apparatus of the present invention insures that the beam-leaded device 13 is accurately positioned on the substrate S with the leads 16 in alignment with the conductors 17. The original orientation of the beam-leaded device 13 on the platform 12 is preserved by the pickup tube 41 which is limited to vertical motion with respect to the bonding tip 21 by the shaft 46 and guide slot 47. As mentioned above, the pickup tube 41 cannot rotate during its movement relative to the bonding tip 21 so that once the beam-leaded device 13 is picked up by the tube 41 the orientation of the device 13 relative to the bonding surface 61 is fixed and cannot change during subsequent bonding operations. Because the bonding tip 21 is held firmly in the pocket formed in the support block 23 by the spring 37 during the time that the beam-leaded device 13 is picked up from the platform 12 and moved into the opening 62, the bonding surface 61 is always located in the same predetermined position relative to the initial pickup position of the device 13. As a result, each beam-leaded device 13 which is picked up from the platform 12 and moved into the opening 62 is moved to the same position on the bonding surface 61.

The bonding apparatus also insures that substantially uniform bonding forces are applied to the leads 16 during the bonding of the leads 16 to the conductors 17 on the substrate S. Since the tapered shoulder 31 formed in the cavity 29 of the bonding tip 21 engages the spherical end of the rod 32, the bonding tip 21 is capable of universal pivotal movement when its tapered sides are moved out of engagement with the slanted walls of the pocket formed in the support member 23. Thus, if the bonding forces applied to the leads 16 on the substrate S are not uniformly distributed, then the bonding tip 21 pivots over the curved surface of the rod 32 into an equilibrium position where substantially equal bonding forces are applied to each of the leads 16. In this manner, the bonding apparatus of the present invention compensates for nonuniform substrate thickness, substrate surface irregularities, and machine variations to distribute bonding forces uniformly over the leads of a beam-leaded device.

If it is desirable to control the application of partial vacuum to the pickup tube 41, the bonding apparatus may be provided with a valve (not shown) connected to the line 64 through which the vacuum is applied to the pickup tube 41. Assuming that the valve is normally closed, no vacuum force would be applied to the beam-leaded device 13 until the projecting end of the tube 41 is moved into contact with the device 13 and the valve is opened. After the tube 41 is moved into the bonding tip 21 to move the semiconductor body 13' into the opening 62 and upon movement of the bonding head 10 toward the substrate S to bring the leads 16 into engagement therewith, the valve may be closed so that no upward suction force is applied to the beam-leaded device 13 during bonding. In this manner, the tendency of the device 13 to rise as bonding forces are applied to the leads 16 would be reduced.

The bonding apparatus described above is merely illustrative of the principles of the present invention, and modifications in the apparatus may be made by persons having ordinary skill in the art without departing from the scope of the invention.

What is claimed is:

1. In a bonding tool for applying bonding forces to leads extending from a beam-leaded device:
- a bonding tip having a bonding surface formed on one side thereof for engaging the leads and an aperture in said bonding surface for receiving a beam-leaded device, said bonding tip also having a bore extending from the opposite side into said tip and terminating at an inwardly tapered side wall which terminates in said aperture;
- a hollow rod having a spherically shaped end fitted into said bore and engaging said tapered side wall to support said bonding tip for pivotal movement over said spherically shaped end; and
- pickup means including a tube mounted within said hollow rod for movement through said aperture relative to said bonding force for holding a beam-leaded device and moving the device into said aperture to bring the leads into engagement with said bonding surface.

2. In an apparatus for bonding leads of a beam-leaded device to conductors on a substrate:
- a bonding tip having a planar bonding surface formed on one side thereof and an aperture in said bonding surface for receiving a beam-leaded device, said bonding tip also having a bore extending from the opposite side into said tip and terminating at an inwardly tapered side wall which terminates in said aperture;

a rod having a spherically shaped end fitted into said bore engaging said tapered side wall and supporting said bonding tip for pivotal movement over the surface of said spherically shaped end;

pickup means for moving and holding a beam-leaded device in said aperture with the leads in engagement with said planar bonding surface; and means for moving said bonding tip toward the substrate to position the leads in registration with the conductors and to apply bonding forces to the leads whereupon said bonding tip pivots over the spherically shaped end of said hollow rod to evenly distribute the bonding forces over the leads.

3. In an apparatus for bonding leads extending from a beam-leaded device to conductors on a substrate:

a bonding tip having a planar bonding surface formed on one side thereof and an aperture in said bonding surface extending into said tip for receiving a beam-leaded device, said bonding tip also having a bore extending from the opposite side partially into said tip and terminating at an inwardly tapered side wall which terminates in said aperture;

a hollow rod having a spherically shaped end fitted into said bore engaging said tapered side wall and supporting said bonding tip for pivotal movement over the curved surface of said spherically shaped end;

a tube movably mounted within said hollow rod for movement relative to said bonding tip through said aperture in said bonding surface, one end of said tube normally projecting through said aperture away from said bonding surface;

means for applying a vacuum to said tube to attract and hold a beam-leaded device against the projecting end of said tube;

means for drawing said tube into said bonding tip to move the beam-leaded device into said aperture and the leads into engagement with said bonding surface; and means for moving said bonding tip and hollow rod toward the substrate to position the leads in registration with the conductors and to apply bonding forces to the leads whereupon said bonding tip pivots over the spherically shaped end of said hollow rod to evenly distribute the bonding forces over the leads.

4. In an apparatus for bonding leads extending from a beam-leaded device to conductors on a substrate, as set forth in claim 3:

means for preventing axial rotation of said tube relative to said bonding tip during movement of said tube into said bonding tip to move the beam-leaded device to a precisely determined position within said aperture with the leads in engagement with said bonding surface.

5. In an apparatus for applying and distributing bonding forces uniformly over a workpiece:

a hollow bonding tip having a bonding surface for engaging the workpiece and applying bonding forces thereto, and a shoulder projecting into the interior of said hollow tip;

a rod having a rounded end fitted into said hollow bonding tip for engaging said shoulder to support said bonding tip for pivotal movement over said rounded end; and means for urging said bonding tip and rod toward the workpiece to apply bonding forces through said bonding surface to the workpiece to pivot said bonding tip over the rounded end of said rod to distribute the bonding forces uniformly over said workpiece.

6. In an apparatus for applying uniform bonding forces to leads extending from a semiconductor body in order to bond the leads to conductive areas on a substrate:

a bonding tip having a planar bonding surface formed on one side thereof and an opening in said bonding surface for receiving the semiconductor body with its leads in registration with said bonding surface, said bonding tip also having a cavity extending from the opposite side and joining said opening with a tapered, interior side wall;

a member having a curved surface positioned within said cavity of said bonding tip, said curved surface engaging said tapered side wall and supporting said bonding tip for pivotal movement over said curved surface; and means for moving and urging said bonding tip and said member toward the substrate to press the leads into engagement with the conductive areas to apply bonding forces thereto whereupon said bonding tip pivots over said curved surface to distribute the bonding forces uniformly over the leads.

7. In a bonding tool for applying uniform bonding forces to a plurality of leads during simultaneous bonding of the leads to a workpiece:

a bonding tip having a bonding face formed on one side thereof for engaging the leads and applying bonding forces thereto, said bonding tip also having a cavity formed in the opposite side with tapered sides to provide a shoulder inside the bonding tip, a member having a curved surface at one end for engaging said shoulder and supporting said bonding tip for pivotal movement over said curved surface, means for urging said member to press said curved surface against said shoulder, and means for moving said bonding tip and said member to move said bonding face into engagement with said leads whereupon said bonding tip acts against said urging means and said bonding tip pivots over said curved surface to an equilibrium position where the forces applied to the leads are uniformly distributed.

8. In an apparatus for bonding leads extending from a beam-leaded device to conductors on a substrate:

a bonding tip having a planar bonding surface for contacting the leads and an opening in said planar bonding surface for receiving the beam-leaded device;

a tube movably mounted within said bonding tip for movement relative to said bonding tip through said opening in said bonding surface, one end of said tube normally projecting from said bonding surface through said opening;

means for applying a partial vacuum to said tube to draw and hold a beam-leaded device against the projecting end thereof;

means for retracting said tube into said bonding tip to move the beam-leaded device into said opening and the leads into engagement with said bonding surface; and means for moving said bonding tip toward the substrate to press the leads into engagement with the conductors to apply bonding forces to the leads and the conductors.

9. In a bonding head;

a support block having an opening extending therethrough with the wall of the opening being tapered;

a bonding tip seated within said opening having a section projecting therefrom, said tip having a peripheral shape conforming to the tapered wall of said opening, said tip having an opening therein, a portion of which defines a tapered shoulder;

a member having an arcuate surface bearing against said tapered shoulder; and means for exerting a force against said member to urge said tip into engagement with said tapered opening in said block.

10. In a bonding head, as defined in claim 9, wherein; said member comprises a rod having a spheroid formed on one end thereof and having a shank section which is polygonal in cross section, and wherein a support is provided having a passage extending therethrough, the cross section of which is polygonal in shape to conform to and receive said polygonal shank section of said rod.

11. An apparatus for bonding leads extending from a beam-leaded device to conductive areas on a substrate, comprising:
a bonding head having
(a) a bonding tip with tapered sides, said head having a planar bonding face formed on its lower surface and an aperture in said bonding face for receiving a beam-leaded device, said bonding tip also having a bore extending from its upper surface into said tip and terminating in an inwardly tapered side wall extending to said aperture;
(b) a support block provided with a socket extending therethrough, the socket having slanted walls for receiving and engaging the tapered sides of said bonding tip such that said planar bonding face of said bonding tip projects from said support block;
(c) means including a hollow rod having a spherically shaped end fitted into said bore and engaging said tapered side wall for biasing said bonding tip into said socket; and
(d) a tube mounted within said hollow rod for movement relative to said bonding tip through said aperture in said bonding face, one end of said tube normally projecting through said aperture away from said bonding face;
means for applying a partial vacuum to said tube to attract and hold a beam-lead device against the projecting end of said tube;
means for drawing said tube into said bonding tip to move the beam-leaded device into said aperture with the leads in engagement with said bonding face; and
means for moving said bonding head toward the substrate to position the leads in registration with the conductive areas such that the movement of said bonding tip and hollow rod terminates and upon continued movement of said support block relative thereto said tapered bonding tip is moved out of engagement with the slanted walls of said socket to permit said bonding tip to pivot over the spherically shaped end of said rod to an equilibrium position to evenly distribute bonding forces over the leads.

12. An apparatus for bonding leads extending from a beam-leaded device to conductive areas on a substrate, as set forth in claim 11, including:
means for supplying energy in the form of heat to said support member; and
said support block being composed of heat conducting material to conduct heat to said bonding tip when said tip is located within said socket so that bonding energy in the form of heat may be applied to the leads engaged by said bonding lead.

13. An apparatus for bonding leads extending from a beam-leaded device to conductive areas on a substrate, as set forth in claim 11, which includes:
means mounted on said rod and rendered effective upon movement of said support block relative to said bonding tip for limiting the amount of relative movement between said support block and said bonding tip.

14. In a bonding tool for applying bonding forces to a workpiece:
a bonding tip;
means mounting said bonding tip for universal pivoting mevement to distribute bonding forces uniformly over the workpiece; and
means mounted for movement relative to said bonding tip to pick up the workpiece and move the workpiece into engagement with said bonding tip.

15. In a bonding tool for applying and distributing bonding forces to peripheral areas of a workpiece:
a bonding tip having bonding surfaces for engaging and applying bonding forces to peripheral areas of the workpiece and a passageway extending through said bonding tip;
means mounted for movement through said passageway in said bonding tip to pick up the workpiece and move the workpiece into engagement with said bonding surfaces; and
means mounting said bonding tip for universal pivoting movement to distribute the bonding forces uniformly over the peripheral areas of the workpiece engaged by said bonding surfaces.

16. In a compression bonding tool for simultaneously bonding metallic leads extending from the body of a beam-leaded device to metallic contact areas on a substrate:
a bonding tip having an aperture formed therein for receiving the body of a beam-leaded device, and bonding surfaces bordering said aperture for engaging and applying bonding forces to the leads;
pickup means located within said aperture for positioning and retaining the body of the beam-leaded device within said aperture with the leads overlying said bonding surfaces;
means mounting said bonding tip for universal pivoting movement to distribute bonding forces applied through said bonding surfaces uniformly over the leads; and
means for moving said bonding tip toward the substrate to position the leads in registration with the contact areas and to apply bonding forces to the leads whereupon said bonding tip pivots to distribute the bonding forces uniformly.

17. In a thermocompression bonding tool for simultaneously bonding leads extending from the body of a beam-leaded device to metallic areas on a substrate, as defined in claim 16, wherein said pickup means comprises:
facilities mounted within said bonding tip for movement through said aperture for applying a holding force to the beam-leaded device; and
means for moving said facilities through said bonding tip to position the body of the beam-leaded device withing said aperture with the leads engaging said bonding surfaces.

References Cited

UNITED STATES PATENTS

| | | | |
|---|---|---|---|
| 3,271,555 | 9/1966 | Hirshon | 228—47 X |
| 3,379,357 | 4/1968 | Chagnon | 228—47 |
| 3,395,845 | 8/1968 | Best | 228—1 |

RICHARD H. EANES, Jr., *Primary Examiner.*